(12) United States Patent
Shin

(10) Patent No.: US 10,038,044 B2
(45) Date of Patent: Jul. 31, 2018

(54) DISPLAY DEVICE HAVING A DRIVING CHIP

(71) Applicant: Samsung Display Co., Ltd., Yongin-si, Gyeonggi-Do (KR)

(72) Inventor: Hye-jin Shin, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/367,137

(22) Filed: Dec. 1, 2016

(65) Prior Publication Data

US 2017/0317153 A1  Nov. 2, 2017

(30) Foreign Application Priority Data

Apr. 28, 2016 (KR) .................. 10-2016-0052212

(51) Int. Cl.
*H01L 27/32* (2006.01)
*H01L 23/00* (2006.01)

(52) U.S. Cl.
CPC .......... *H01L 27/3262* (2013.01); *H01L 24/13* (2013.01); *H01L 24/16* (2013.01); *H01L 24/81* (2013.01); *H01L 27/3276* (2013.01); *H01L 2224/13118* (2013.01); *H01L 2224/13144* (2013.01); *H01L 2224/13147* (2013.01); *H01L 2224/13155* (2013.01); *H01L 2224/13166* (2013.01); *H01L 2224/16227* (2013.01); *H01L 2224/81203* (2013.01); *H01L 2227/323* (2013.01)

(58) Field of Classification Search
CPC . H01L 27/3262; H01L 27/3276; H01L 24/13; H01L 24/16; H01L 24/81; H01L 2224/05075; H01L 2224/0508; H01L 2224/05082–2224/05098
See application file for complete search history.

(56) References Cited

U.S. PATENT DOCUMENTS 6,195,148 B1 * 2/2001 Sasuga ............. G02F 1/133308
                                                    349/149
6,515,720 B1 * 2/2003 Iizuka ............. G02F 1/136213
                                                    349/110

(Continued)

FOREIGN PATENT DOCUMENTS

KR    10-2014-0067523 A    6/2014
KR    10-2015-0012118 A    2/2015
KR    10-2015-0042967 A    4/2015

*Primary Examiner* — Ida M Soward
(74) *Attorney, Agent, or Firm* — Lewis Roca Rothgerber Christie LLP

(57) ABSTRACT

A display device includes: a display substrate having an active area, which includes a pixel array, and a peripheral area around the active area; a driving chip on the display substrate; and a conductive combination member connecting the display substrate to the driving chip, wherein the display substrate includes: a first signal line in the peripheral area to transfer a driving signal from the driving chip to the active area, the first signal line including a first connection pad; a second connection pad at a different layer from the first connection pad and overlapping at least a portion of the first signal line; and a contact member contacting the first connection pad, the second connection pad, and the conductive combination member.

25 Claims, 21 Drawing Sheets

(56) References Cited

U.S. PATENT DOCUMENTS

| | | | | |
|---|---|---|---|---|
| 7,251,007 B2* | 7/2007 | Ashizawa | G02F 1/134363 | 349/110 |
| 7,423,348 B2* | 9/2008 | Lu | H01L 24/11 | 257/781 |
| 7,439,939 B2* | 10/2008 | Yun | G02F 1/13452 | 345/1.1 |
| 7,903,207 B2* | 3/2011 | Lee | G02F 1/133514 | 349/106 |
| 8,355,087 B2* | 1/2013 | Yeh | G02F 1/13458 | 349/138 |
| 8,400,438 B2* | 3/2013 | Lee | G02F 1/13452 | 345/204 |
| 8,817,217 B2* | 8/2014 | Kwak | G02F 1/134363 | 349/149 |
| 9,041,869 B2* | 5/2015 | Kim | G06F 3/0412 | 257/432 |
| 9,647,243 B2* | 5/2017 | Hong | G02F 1/13452 | |
| 2007/0045841 A1* | 3/2007 | Cho | H01L 23/3171 | 257/737 |
| 2007/0097278 A1* | 5/2007 | Rho | G02F 1/13338 | 349/12 |
| 2007/0103028 A1* | 5/2007 | Lewis | B81B 7/0006 | 310/300 |
| 2007/0268442 A1* | 11/2007 | Oh | G02F 1/136204 | 349/149 |
| 2008/0129717 A1* | 6/2008 | Lee | G09G 3/3677 | 345/204 |
| 2011/0279023 A1* | 11/2011 | Nishioka | H01L 27/3253 | 313/504 |
| 2013/0271388 A1* | 10/2013 | Chu | G06F 3/0412 | 345/173 |
| 2014/0043308 A1* | 2/2014 | Lee | G09G 3/3677 | 345/205 |
| 2015/0214505 A1 | 7/2015 | Xiong et al. | | |
| 2015/0234425 A1* | 8/2015 | Kim | G06F 1/16 | 345/174 |
| 2016/0100483 A1* | 4/2016 | Hwang | H05B 33/06 | 313/505 |
| 2016/0218153 A1* | 7/2016 | Kim | H01L 27/323 | |
| 2016/0226030 A1* | 8/2016 | Heo | H01L 27/3269 | |
| 2017/0331371 A1* | 11/2017 | Parto | H02M 3/156 | |

* cited by examiner

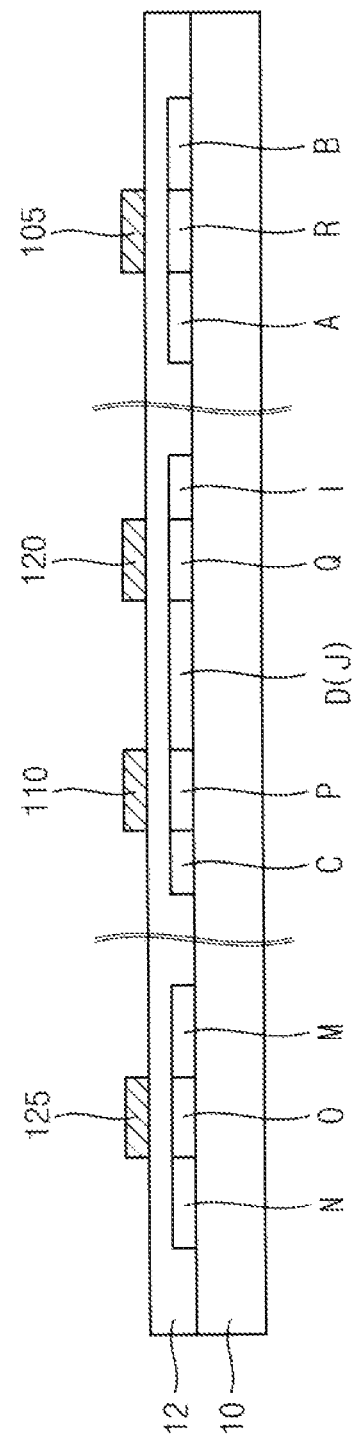

DISPLAY DEVICE HAVING A DRIVING CHIP

CROSS-REFERENCE TO RELATED APPLICATION

This application claims priority to and the benefit of Korean Patent Application No. 10-2016-0052212 filed on Apr. 28, 2016 in the Korean Intellectual Property Office, the entire disclosure of which is incorporated by reference herein in its entirety.

BACKGROUND

1. Field

One or more aspects of example embodiments of the present invention relate to a display device.

2. Description of the Related Art

A display device displays an image based on light emitted by pixels, and includes a driver for driving each pixel.

The driver may, for example, be integrated on a substrate of a display device, or may be mounted on a driving chip, which is combined with the substrate of the display device.

According to a related art method, the driving chip may be combined with the substrate of the display device through a pressing process, and may be electrically connected to a connection pad or a signal transfer line, which is formed on the substrate, through a bump.

In such a process of combining the driving chip with the substrate, pressure is applied to an area where the driving chip is combined with the substrate. Thus, the signal transfer line or an insulation layer covering the signal transfer line may be damaged thereby causing failures such as disconnection of the signal transfer line or the like.

The above information disclosed in this Background section is only for enhancement of understanding of the background of the invention, and therefore it may contain information that does not constitute prior art.

SUMMARY

One or more aspects of example embodiments of the present invention relate to a display device, for example, a display device including a driving chip.

One or more aspects of example embodiments of the present invention include a display device capable of improving reliability.

According to one or more example embodiments of the present invention, a display device includes: a display substrate having an active area, which comprises a pixel array, and a peripheral area around the active area; a driving chip on the display substrate; and a conductive combination member connecting the display substrate to the driving chip, wherein the display substrate comprises: a first signal line in the peripheral area to transfer a driving signal from the driving chip to the active area, the first signal line including a first connection pad; a second connection pad at a different layer from the first connection pad and overlapping at least a portion of the first signal line; and a contact member contacting the first connection pad, the second connection pad, and the conductive combination member.

According to some example embodiments, the display substrate further comprises a second signal line connected to the second connection pad to transfer the driving signal to the active area.

According to some example embodiments, the first and second signal lines are electrically connected to a data line in the active area or a demultiplexer connected to the data line.

According to some example embodiments, the second connection pad and the second signal line are on the first connection pad and the first signal line.

According to some example embodiments, the display substrate further comprises a first insulation layer on the first signal line, the first insulation layer comprising an opening exposing the first connection pad through the first insulation layer.

According to some example embodiments, the display substrate further comprises a second insulation layer on the second connection pad, the second insulation layer comprising an opening exposing the first connection pad and the second connection pad through the second insulation layer.

According to some example embodiments, the first and second signal lines comprise a same material.

According to some example embodiments, the first and second signal lines comprise a different material from the contact member.

According to some example embodiments, the pixel array includes: a gate electrode formed from a same layer as the first signal line; a storage pattern formed from a same layer as the second connection pad and overlapping at least a portion of the gate electrode; and a data line formed form a same layer as the contact member.

According to some example embodiments, the display device further includes a data line configured to provide the driving signal to the pixel array.

According to some example embodiments, the contact member comprises a first contact portion contacting the first connection pad, and a second contact portion contacting the second connection pad.

According to some example embodiments, the conductive combination member overlaps the first contact portion and the second contact portion in a plan view.

According to some example embodiments, the contact member extends continuously from the first contact portion to the second contact portion in a plan view.

According to some example embodiments, the conductive combination member overlaps the first contact portion, and is spaced apart from the second contact portion, in a plan view.

According to some example embodiments, the second connection pad includes an extending portion that extends along the first signal line and overlaps the first signal line.

According to some example embodiments, a length of the second connection pad including the extending portion is less than a length of the first signal line.

According to some example embodiments, the length of the second connection pad including the extending portion is greater than a length of an area overlapping the conductive combination member.

According to some example embodiments, the first signal line comprises a plurality of first signal lines, and the conductive combination member includes a plurality of conductive bumps each corresponding to one of the first signal lines and arranged in a staggered configuration, wherein the extending portion extends in a first direction and is between the conductive bumps adjacent the extending portion and spaced apart from each other in a direction crossing the first direction.

According to some example embodiments, a length of the extending portion is greater than a length of the conductive bumps adjacent thereto.

According to some example embodiments, the second connection pad including the extending portion is on the first signal line, wherein a width of the extending portion is greater than a width of the first signal line.

According to one or more example embodiments of the present invention, a display device includes: a display substrate having a display area and a non-display area around the display area; a driving chip on the display substrate; a first connection pad on the display substrate; a second connection pad on the display substrate and offset from the first connection pad in a direction normal to the display substrate; and a contact layer on the display substrate, wherein the driving chip is electrically connected to the first connection pad and the second connection pad through the contact layer.

According to some example embodiments, the display device further includes a conductive combination member connecting the driving chip to the display substrate through the contact layer.

According to some example embodiments, the display device further includes a first signal line to transfer a driving signal from the driving chip to the display area, wherein the first signal line comprises the first connection pad.

According to some example embodiments, the display device further includes a second signal line over the first signal line, wherein the second signal line comprises the second connection pad.

According to some example embodiments, the contact layer is directly connected to the first connection pad and the second connection pad.

According to aspects of one or more example embodiments of the present invention, a connection structure for combining a driving chip may be protected by an additional connection pad and/or a doubled wiring. Thus, a driving reliability of a connection with a driving chip in a display device may be improved, which may improve overall display quality and reliability.

BRIEF DESCRIPTION OF THE DRAWINGS

Aspects of one or more example embodiments of the present invention will be more clearly understood from the following detailed description taken in conjunction with the accompanying drawings.

FIGS. 16A, 16B, 17A, 17B, 18A, 18B and 19 are cross-sectional views illustrating a method for manufacturing a display device, according to one or more example embodiments of the present invention.

DETAILED DESCRIPTION

Figure 1:
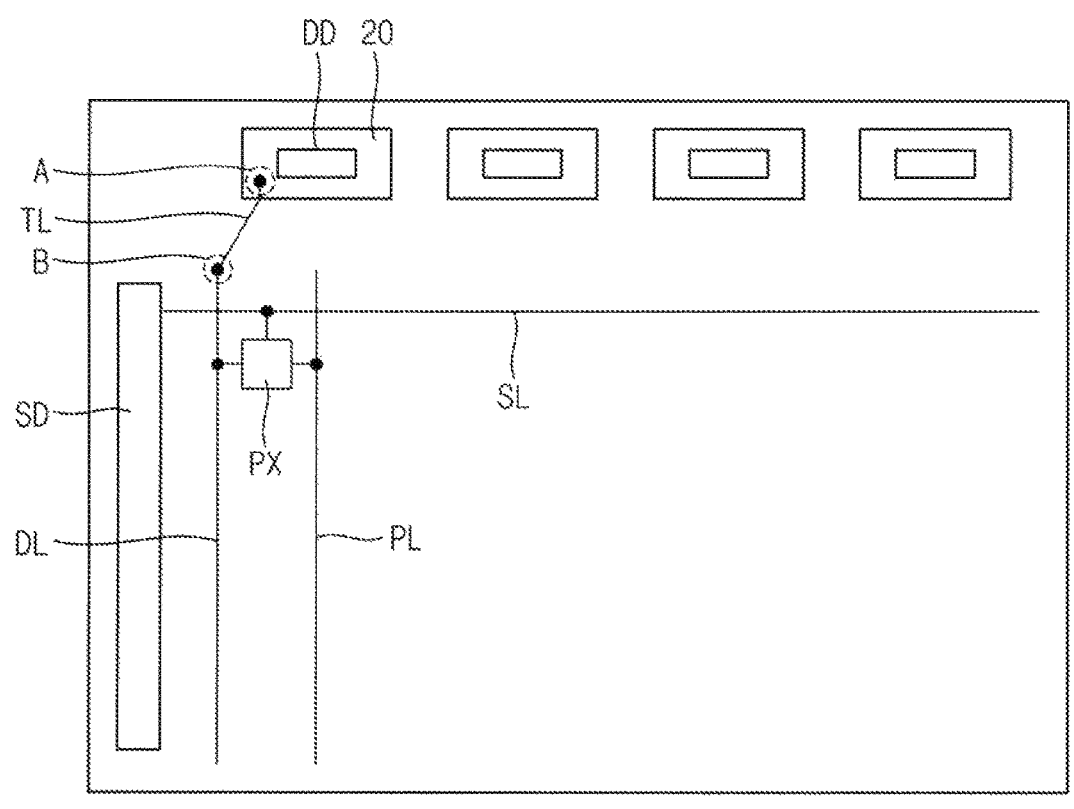
FIG. 1 is a plan view illustrating a display device, according to one or more example embodiments of the present invention.

Aspects of various example embodiments of the present invention will be described hereinafter with reference to the accompanying drawings, in which some example embodiments are shown. The present invention, however, may be embodied in various different forms, and should not be construed as being limited to only the illustrated embodiments herein. Rather, these embodiments are provided as examples so that this disclosure will be more thorough and more complete, and will more fully convey the aspects and features of the present invention to those skilled in the art. In the drawings, the relative sizes of elements, layers, and regions may be exaggerated for clarity. The same reference numerals can be used for the same elements in the drawings, and some repetitive explanation may be omitted for brevity.

FIG. 1 is a plan view illustrating a display device, according to one or more example embodiments of the present invention.

Referring to FIG. 1, a display device includes a display substrate including an array of pixels PX, and one or more driving chips 20 providing a driving signal to the pixels PX. For example, the display substrate includes an active area (or display area) where the array of the pixels PX is disposed, and a peripheral area (e.g., a non-display area) around (e.g., surrounding) the active area. The driving chip 20 may be combined on (e.g., attached or mounted at) the peripheral area.

For example, each of the pixels PX may be electrically connected to a scan line SL, which extends in a first direction D1, and a data line DL, which extends in a second direction D2 crossing the first direction D1. Furthermore, each of the pixels PX may be electrically connected to a power line PL to receive a power. The driving chip 20 may provide a data signal to the data line DL. The driving chip 20 may include a data driving part (or data driver) DD that generates the data signal. Furthermore, the display device further includes a scan driving part (or scan driver) SD that provides a scan signal to the scan line SL. The scan driving part SD may include a circuit part (or circuit, circuit component, or circuit structure) integrated on the display substrate. The data driving part DD may include a circuit part (or circuit, component, or circuit structure) integrated on the driving chip 20. Although FIG. 1 illustrates a single pixel PX, a person having ordinary skill in the art would understand and appreciate that the array of pixels PX includes a plurality of pixels PX arranged, for example, in columns and rows within the active area.

The driving chip 20 may be on or combined with (e.g., attached or mounted at) the peripheral area of the display substrate. The display substrate includes (or has formed thereon) a signal transfer line (or signal line) TL that transfers the data signal to the data line DL from the driving chip 20.

Figure 2:
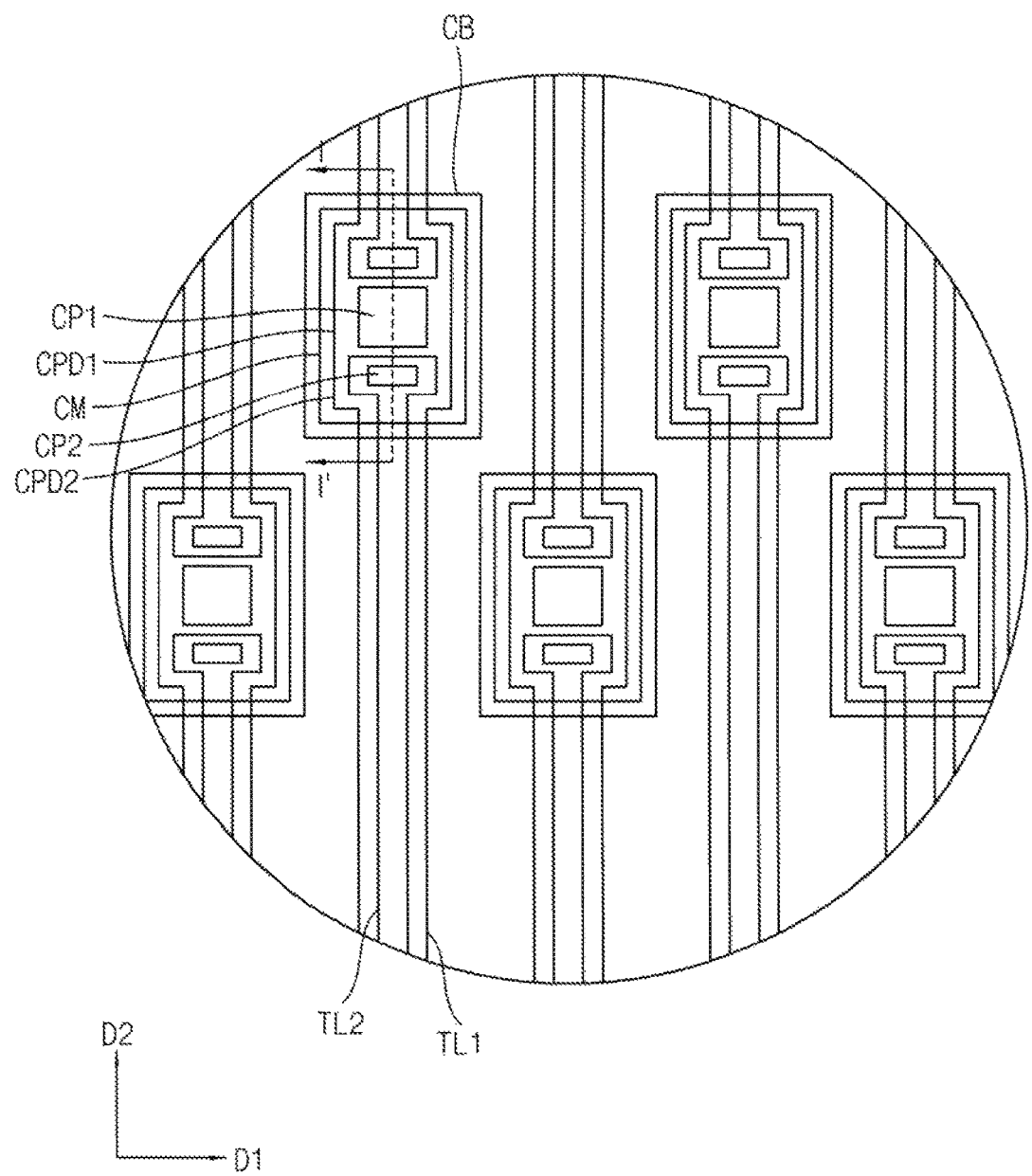
FIG. 2 is an enlarged plan view illustrating further details of the region 'A' of FIG. 1.
Figure 3:
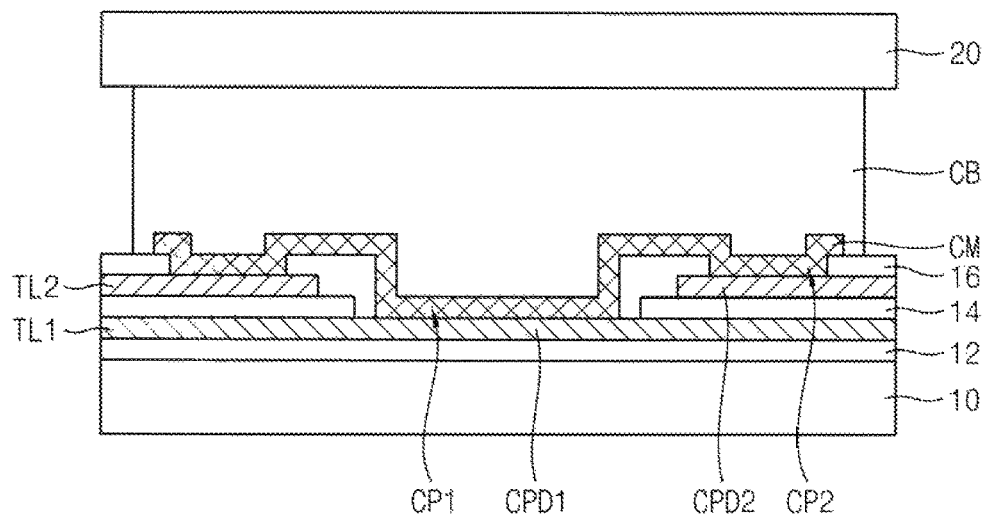
FIG. 3 is a cross-sectional view taken along the line I-I' of FIG. 2.

FIG. 2 is an enlarged plan view illustrating the region CA' of FIG. 1 at the peripheral area of the display substrate, where the driving chip 20 is combined with (e.g., attached or mounted at) the display substrate. FIG. 3 is a cross-sectional view taken along the line I-I' of FIG. 2.

Referring to FIGS. 2 and 3, the display substrate includes a first signal transfer line (or first signal line) TL1, a second signal transfer line (or second signal line) TL2, which is disposed in a different layer (e.g., is vertically offset in a cross-sectional view or in a direction normal to the display substrate and/or is separated by one or more other layers or components) from the first signal transfer line TL1, and a contact member (e.g., a conductive layer or contact layer) CM. The contact member CM is electrically connected to the first and second signal transfer lines TL1 and TL2, respectively. The first signal transfer line TL1 includes a first connection pad CPD1 contacting the contact member CM. The second signal transfer line TL2 includes a second connection pad CPD2 contacting the contact member CM. The first signal transfer line TL1, the second signal transfer line TL2 and the contact member CM are disposed on a base substrate 10. The second connection pad CPD2 overlaps at least a portion of the first signal transfer line TL1. For example, the second connection pad CPD2 may be disposed on at least a portion of the first signal transfer line TL1.

The first and second connection pads CPD1 and CPD2 are not limited or defined to have a specific shape. For example, portions of the first and second signal transfer lines TL1 and TL2, which overlap the contact member CM, may be referred to as the first and second connection pads CPD1 and CPD2.

The first and second signal transfer lines TL1 and TL2 may extend parallel to the second direction D2 toward the active area. Furthermore, the first and second signal transfer lines TL1 and TL2 may partially extend in an inclined direction (e.g., at an angle relative to the second direction D2) as illustrated in FIG. 1.

The first and second signal transfer lines TL1 and TL2 may overlap each other in a plan view. Although a width of the first signal transfer line TL1 is illustrated in FIG. 2 to be greater than a width of the second signal transfer line TL2, embodiments of the present invention are not limited thereto, and a width of the first signal transfer line TL1 may be smaller than or same as a width of the second signal transfer line TL2.

According to some example embodiments, the first signal transfer line TL1 may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd) or scandium (Sc), an alloy thereof, a nitride thereof, strontium ruthenium oxide (SRO), zinc oxide (ZnOx), indium tin oxide (ITO), tin oxide (SnOx), indium oxide (InOx), gallium oxide (GaOx), indium zinc oxide (IZO) or the like. These can be used each alone or in a combination thereof. Furthermore, the first signal transfer line TL1 may have a single-layered structure or a multi-layered structure including different materials.

While the second signal transfer line TL2 may include (or consist of or consist essentially of) a same material as the first signal transfer line TL1 according to some example embodiments, the second signal transfer line TL2 may also include (or consist of or consist essentially of) a different material from the first signal transfer line TL1 in some example embodiments, and may have a single-layered structure or a multi-layered structure including different materials.

A first insulation layer 14 covers the first connection pad CPD1 and the first signal transfer line TL1, and includes an opening that exposes at least a portion of the first connection pad CPD1.

A second insulation layer 16 covers the second connection pad CPD2 and the second signal transfer line TL2, and includes an opening that exposes at least a portion of the second connection pad CPD2.

According to some example embodiments, the first and second insulation layers 14 and 16 may include silicon oxide, silicon nitride, silicon oxynitride, silicon carbonitride, silicon oxycarbide and/or the like. Furthermore, the first and second insulation layers 14 and 16 may have a single-layered structure or a multi-layered structure including different materials.

According to some example embodiments, a third insulation layer 12 may be disposed between the first signal transfer line TL1 and the base substrate 10.

The contact member CM overlaps the first connection pad CPD1 and the second connection pad CPD2 in a plan view. The contact member CM includes a first contact portion CP1 and a second contact portion CP2, which respectively contact (e.g., directly contact) the first and second connection pads CPD1 and CPD2 via openings formed through the first insulation layer 14 and the second insulation layer 16.

According to some example embodiments, the contact member CM may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd) or scandium (Sc), an alloy thereof, a nitride thereof, strontium ruthenium oxide (SRO), zinc oxide (ZnOx), indium tin oxide (ITO), tin oxide (SnOx), indium oxide (InOx), gallium oxide (GaOx), indium zinc oxide (IZO) and/or the like. These can be used each alone or in a combination thereof. Furthermore, the contact member CM may have a single-layered structure or a multi-layered structure including different materials.

In an exemplary embodiment, the contact member CM may include a different material (or consist of, or consist essentially of, a different material or a different group of materials) from the first and second connection pads CPD1 and CPD2. For example, the contact member CM may have a triple-layered structure of titanium/aluminum/titanium (or consisting of, or consisting essentially of, titanium/aluminum/titanium), and the first and second connection pads CPD1 and CPD2 may include (or consist of or consist essentially of) molybdenum.

The driving chip 20 may be physically combined with (e.g., attached to or mounted on) and electrically connected to the display substrate through a conductive combination member (or conductive material) such as a conductive bump CB. The conductive bump CB contacts the driving chip 20 and the contact member CM to transfer a driving signal, which is provided by the driving chip 20, to the first and second signal transfer lines TL1 and TL2 through the first and second connection pads CPD1 and CPD2. According to some example embodiments, the conductive bump CB may overlap the first contact portion CP1 and the second contact portion CP2 of the contact member CM in a plan view.

The driving chip 20 may be combined with (e.g., attached to or mounted on) the display substrate through a heat-pressing process. Thus, the conductive bump CB may include a metal that has a relatively low melting temperature, for example, copper, gold, an alloy thereof or the like. The conductive bump CB may further include zinc, nickel, titanium and/or the like as desired.

According to some example embodiments, the first and second signal transfer lines TL1 and TL2 may extend in opposite directions from the contact member CM. A first end of each of the first and second signal transfer lines TL1 and TL2 may be electrically connected to the data line DL, and a second end, which is opposite to the first end, of the first and second signal transfer lines TL1 and TL2, may be electrically connected to an inspection pad. In another exemplary embodiment, the first and second signal transfer lines TL1 and TL2 may extend in one direction from the contact member CM.

The first and second signal transfer lines TL1 and TL2 may extend toward the active area including the array of the pixels PX to be electrically connected to the data line DL.

A connection structure includes the contact member CM and the conductive bump CB. A plurality of connection structures corresponding to adjacent groups of first and second signal transfer lines TL1 and TL2 may be aligned along a direction, or arranged in a staggered configuration (see, e.g., FIG. 2). For example, the connection structures may form at least two rows, and the connection structures disposed in adjacent two columns may be disposed in different rows.

Figure 4:
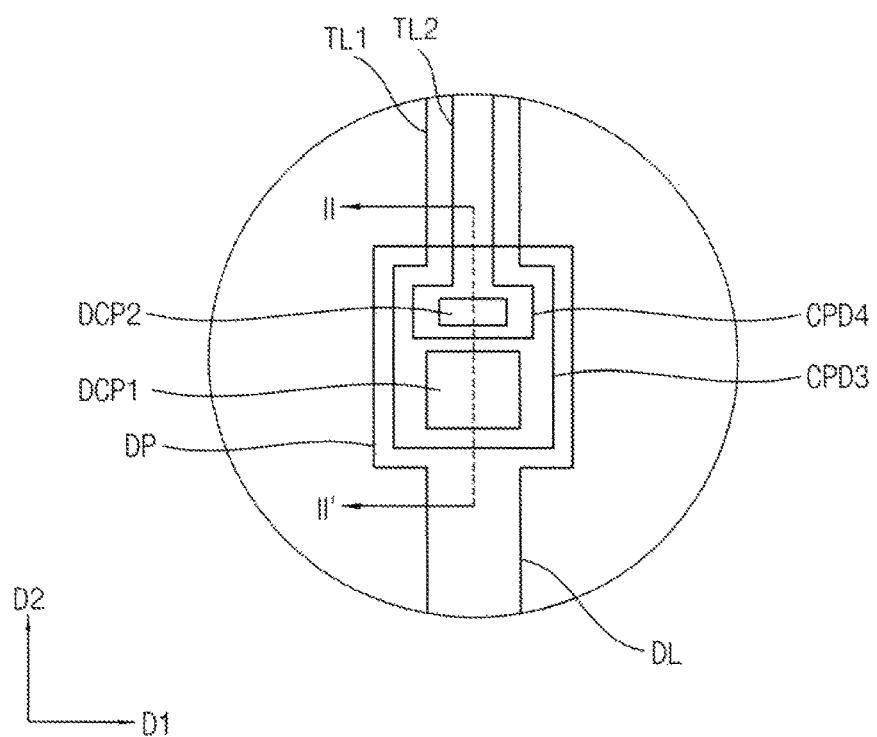
FIG. 4 is an enlarged plan view illustrating further details of the region CBI of FIG. 1.
Figure 5:
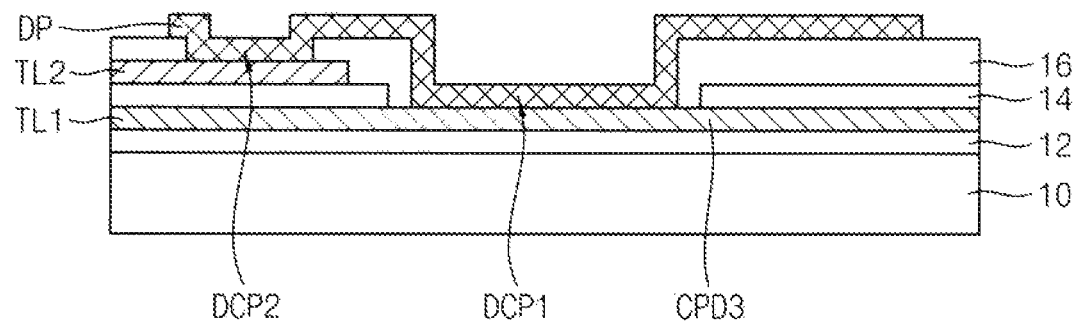
FIG. 5 is a cross-sectional view taken alone the line II-II' of FIG. 4.

FIG. 4 is an enlarged plan view of the region CBI of FIG. 1, illustrating aspects of a connection part of the signal transfer lines and the data line DL. FIG. 5 is a cross-sectional view taken alone the line II-II' of FIG. 4.

Referring to FIGS. 4 and 5, the first signal transfer line TL1 includes a third connection pad CPD3 at an end of the first signal transfer line TL1. The second signal transfer line TL2 includes a fourth connection pad CPD4 at an end of the second signal transfer line TL2.

The third and fourth connection pads CPD3 and CPD4 contact the data pad DP. For example, the data pad DP may include a first data contact portion DCP1, which contacts the third connection pad CPD3 via an opening formed through the first insulation layer 14 and the second insulation layer 16, and a second data contact portion DCP2, which contacts the fourth connection pad CPD4 via an opening formed through the second insulation layer 16.

The data pad DP may be an end portion of the data line DL. Thus, the third and fourth connection pad CPD3 and CPD4 are electrically connected to the data line DL to transfer a data signal to the data line DL According to some example embodiments of the present invention, when the display device includes a demultiplexer, the first and second signal transfer lines TL1 and TL2 may be electrically connected to the demultiplexer, and may be electrically connected to the data line DL via the demultiplexer to transfer the data signal to the data line DL.

According to some example embodiments of the present invention, the connection structure including the conductive bump may be electrically connected to an output pad of the driving chip 20. In another example embodiment, the connection structure may be electrically connected to an input pad of the driving chip 20.

According to some example embodiments of the present invention, the driving chip 20 includes a data driving part (or data driver) to provide the data signal to the data line, however, the present invention is not limited thereto. For example, when the driving chip 20 includes a scan driving part (or scan driver), the connection structure may be used for electrically connecting a scan driving chip to a scan line.

Figure 6:
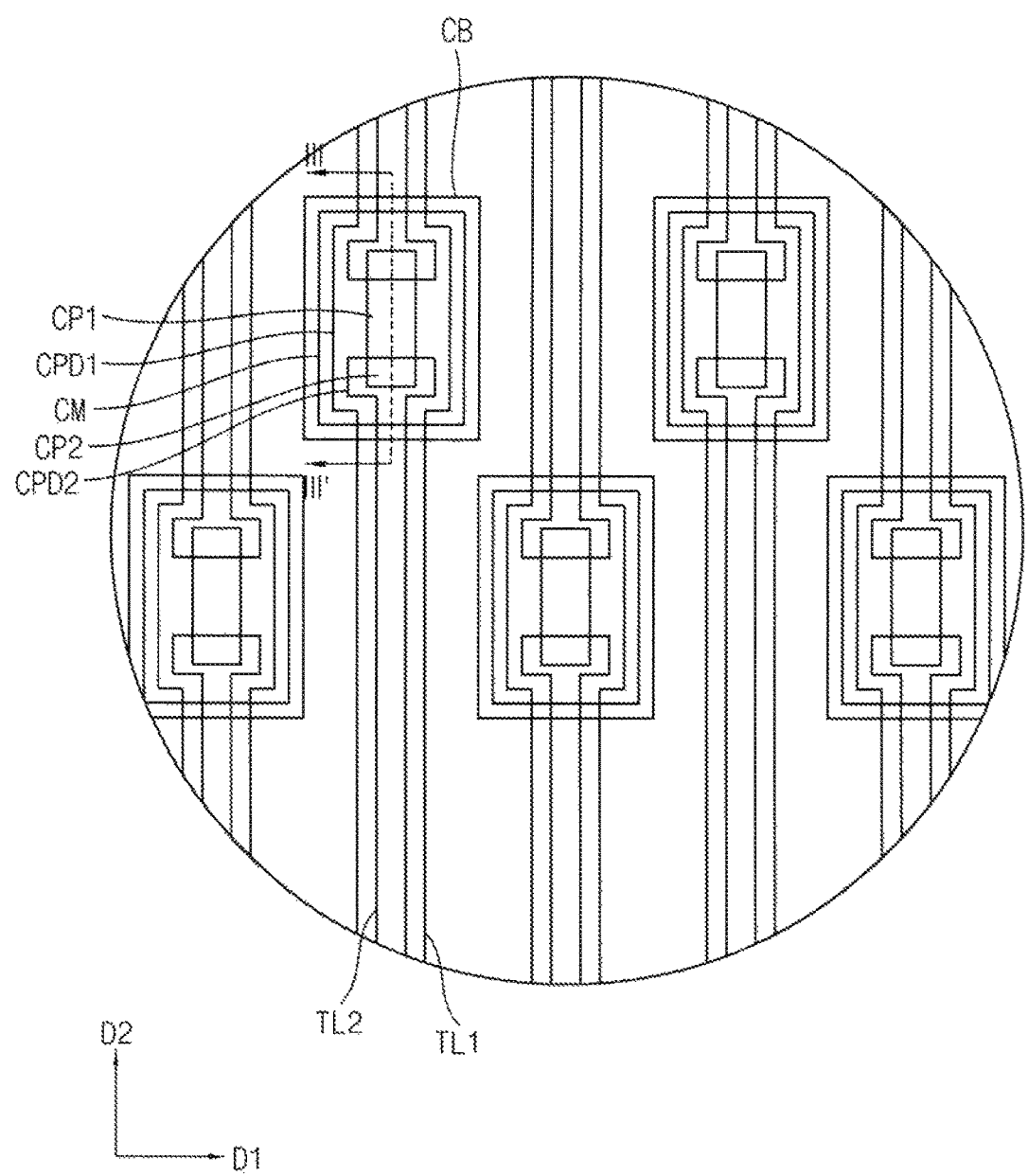
FIG. 6 is an enlarged plan view illustrating further details of a peripheral area, where a driving chip is combined, of a display device, according to one or more example embodiments of the present invention.
Figure 7:
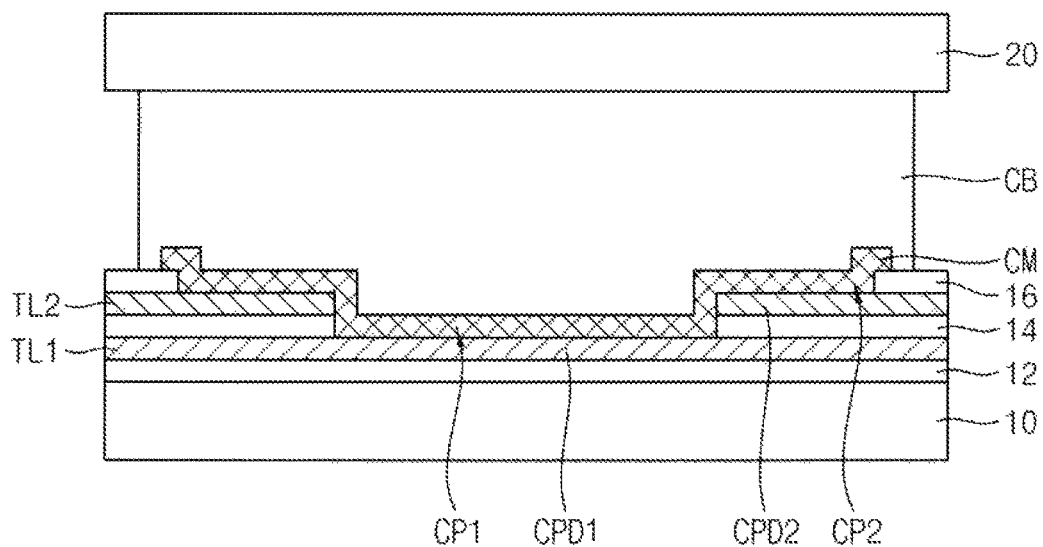
FIG. 7 is a cross-sectional view taken along the line III-III' of FIG. 6.

FIG. 6 is an enlarged plan view illustrating a peripheral area, where a driving chip is combined with (e.g., attached to or mounted on) a display substrate of a display device, according to one or more example embodiments of the present invention. FIG. 7 is a cross-sectional view taken along the line III-III' of FIG. 6.

Referring to FIGS. 6 and 7, a display substrate includes a first signal transfer line TL1, a second signal transfer line TL2 disposed in a different layer from the first signal transfer line TL1, and a contact member CM. The contact member CM is electrically connected to the first and second signal transfer lines TL1 and TL2, respectively. The first signal transfer line TL1 includes a first connection pad CPD1 contacting the contact member CM. The second signal transfer line TL2 includes a second connection pad CPD2 contacting the contact member CM.

The contact member CM overlaps the first connection pad CPD1 and the second connection pad CPD2 in a plan view. The contact member CM includes a first contact portion CP1 and a second contact portion CP2, which respectively contact the first and second connection pads CPD1 and CPD2 via an opening formed through a first insulation layer 14 and a second insulation layer 16.

A driving chip 20 is combined with (e.g., attached to or mounted on) the display substrate by a conductive bump CB, and is electrically connected to the contact member CM via the conductive bump CB.

According to some example embodiments of the present invention, the opening that exposes the first connection pad CPD1 and the second connection pad CPD2 may have a continuous shape in a plan view. Thus, the first contact portion CP1 and the second contact portion CP2 may be substantially continuously connected (e.g., continuously connected) to each other through the material of the contact member CM in a plan view. That is, the contact member CM may extend continuously from the first contact portion CP1 to the second contact portion CP2 in a plan view.

The above structure may remove an insulation layer between the first contact portion CP1 and the second contact portion CP2 to reduce a height difference of the contact member CM disposed and formed in the opening. Thus, instances of bonding failures caused in the process of combining the conductive bump CM with the contact member CM may be prevented or reduced.

Figure 8:
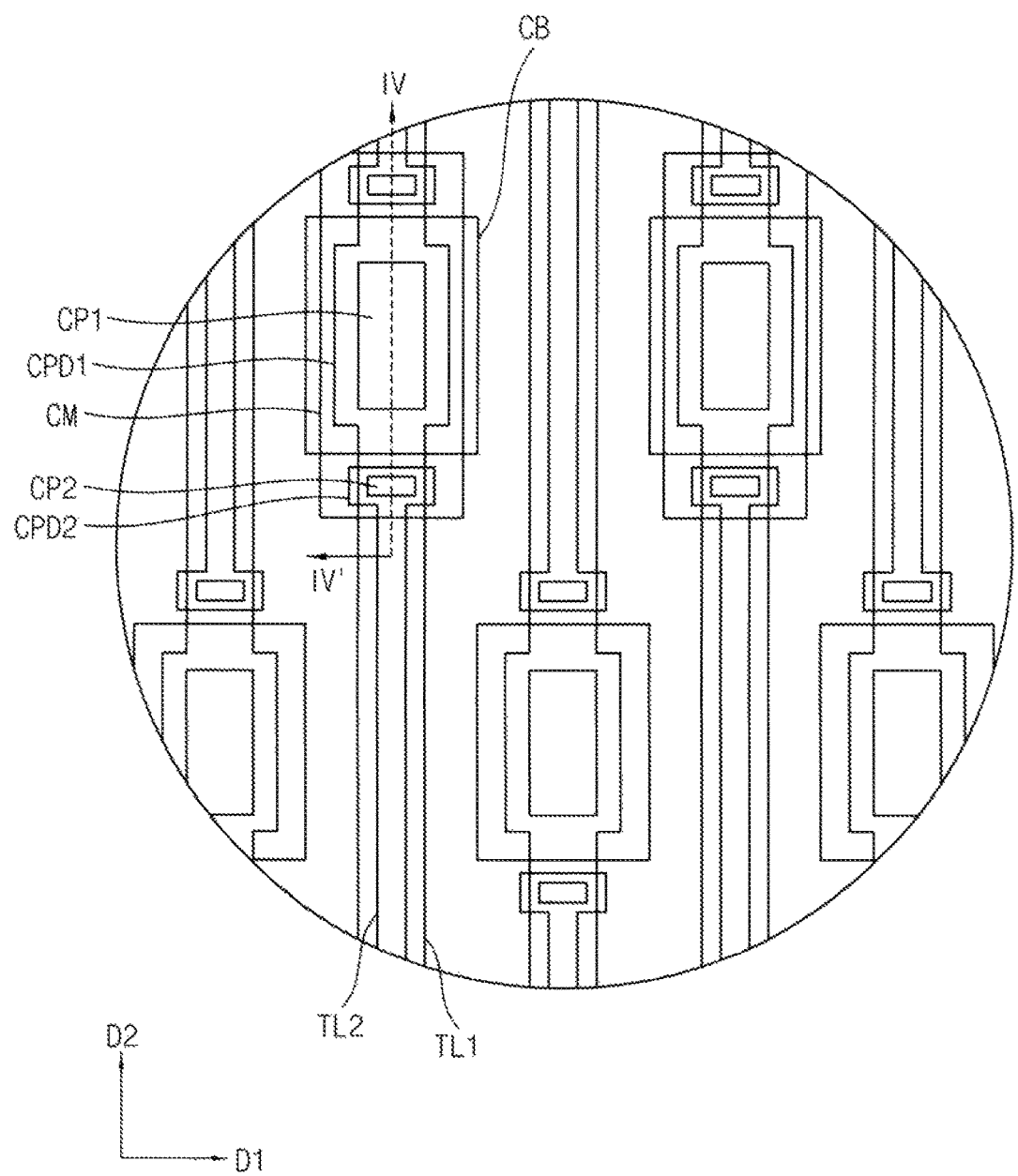
FIG. 8 is an enlarged plan view illustrating further details of a peripheral area, where a driving chip is combined, of a display device, according to one or more example embodiments of the present invention.
Figure 9:
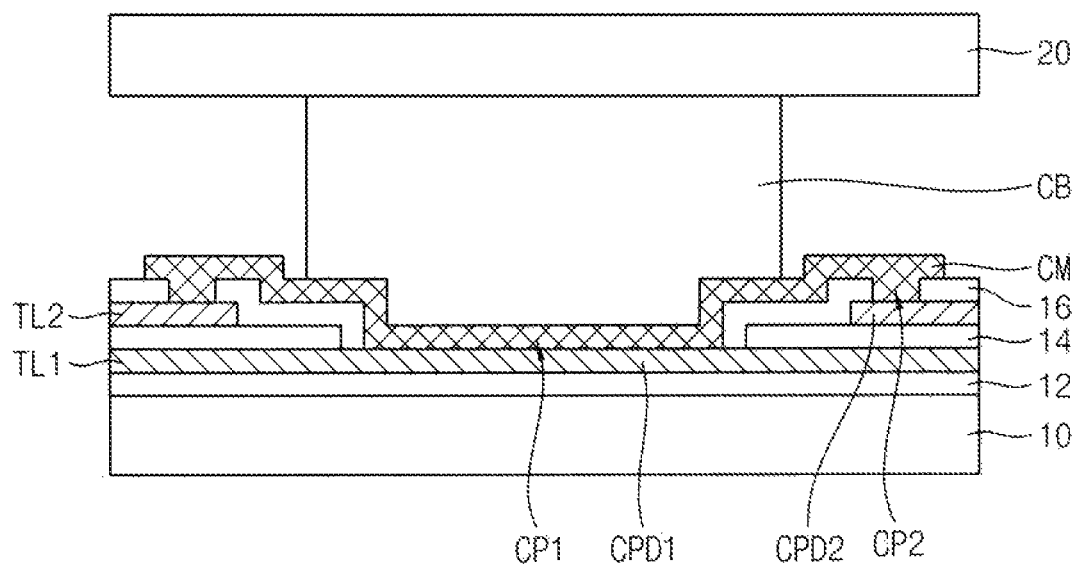
FIG. 9 is a cross-sectional view taken along the line IV-IV' of FIG. 8.

FIG. 8 is an enlarged plan view illustrating a peripheral area, where a driving chip is combined, of a display device according to one or more example embodiments of the present invention. FIG. 9 is a cross-sectional view taken along the line IV-IV' of FIG. 8.

Referring to FIGS. 8 and 9, a display substrate includes a first signal transfer line TL1, a second signal transfer line TL2 disposed in a different layer from the first signal transfer line TL1, and a contact member CM. The contact member CM is electrically connected to the first and second signal transfer lines TL1 and TL2, respectively. The first signal transfer line TL1 includes a first connection pad CPD1 contacting the contact member CM. The second signal transfer line TL2 includes a second connection pad CPD2 contacting the contact member CM.

The contact member CM overlaps the first connection pad CPD1 and the second connection pad CPD2 in a plan view. The contact member CM includes a first contact portion CP1 and a second contact portion CP2, which respectively contact the first and second connection pads CPD1 and CPD2 via openings formed through a first insulation layer 14 and a second insulation layer 16.

A driving chip 20 is combined with (e.g., attached to or mounted on) the display substrate by a conductive bump CB, and is electrically connected to the contact member CM via the conductive bump CB.

According to some example embodiments of the present invention, the conductive bump CB is spaced apart (or laterally offset) from the second connection pad CPD2 in a plan view. Thus, the conductive bump CB overlaps the first connection pad CPD1 and does not overlap the second connection pad CPD2. Therefore, a height difference of an area where the conductive bump CB contacts the contact member CM may be reduced. Thus, instances of bonding failures caused in the process of combining the conductive bump CM with the contact member CM may be prevented or reduced.

Figure 10:
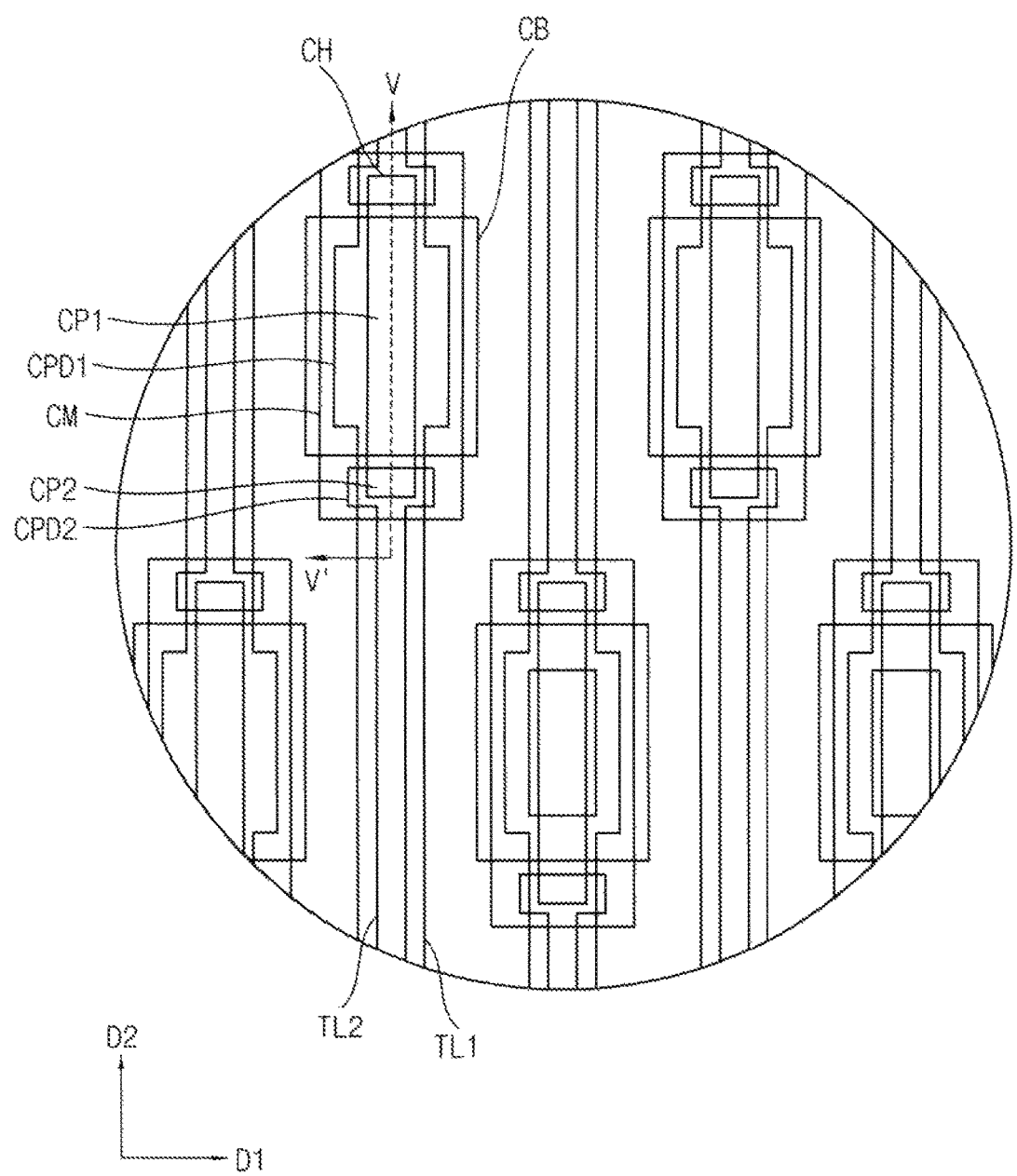
FIG. 10 is an enlarged plan view illustrating further details of a peripheral area, where a driving chip is combined, of a display device, according to one or more example embodiments of the present invention.
Figure 11:
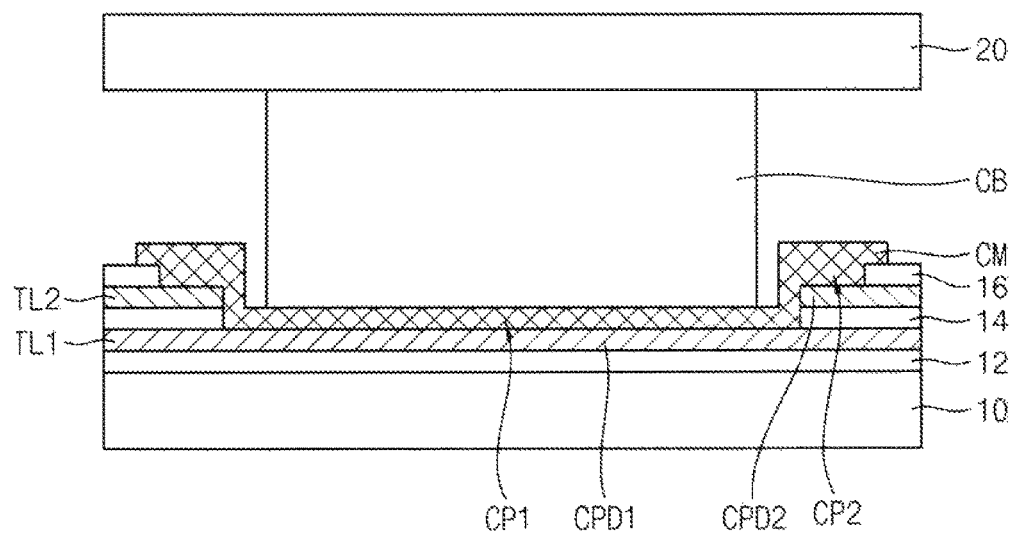
FIG. 11 is a cross-sectional view taken along the line V-V' of FIG. 10.

FIG. 10 is an enlarged plan view illustrating a peripheral area, where a driving chip is combined, of a display device according to one or more example embodiments of the present invention. FIG. 11 is a cross-sectional view taken along the line V-V' of FIG. 10.

Referring to FIGS. 10 and 11, a display substrate includes a first signal transfer line TL1, a second signal transfer line TL2 disposed in a different layer from the first signal transfer line TL1, and a contact member CM. The contact member CM is electrically connected to the first and second signal transfer lines TL1 and TL2, respectively. The first signal transfer line TL1 includes a first connection pad CPD1 contacting the contact member CM. The second signal transfer line TL2 includes a second connection pad CPD2 contacting the contact member CM.

The contact member CM overlaps the first connection pad CPD1 and the second connection pad CPD2 in a plan view. The contact member CM includes a first contact portion CP1 and a second contact portion CP2, which respectively contact the first and second connection pads CPD1 and CPD2 via an opening formed through a first insulation layer 14 and a second insulation layer 16.

A driving chip 20 is combined with (e.g., attached to or mounted on) the display substrate by a conductive bump CB, and is electrically connected to the contact member CM via the conductive bump CB.

According to one or more example embodiments of the present invention, the conductive bump CB is spaced apart from the second connection pad CPD2 in a plan view. Thus, the conductive bump CB overlaps the first connection pad CPD1 and does not overlap the second connection pad CPD2. Therefore, a height difference of an area where the conductive bump CB contacts the contact member CM may be reduced. Thus, instances of bonding failures caused in the process of combining the conductive bump CM with the contact member CM may be prevented or reduced.

Furthermore, the opening that exposes the first connection pad CPD1 and the second connection pad CPD2 may have a continuous shape in a plan view, Thus, the first contact portion CP1 and the second contact portion CP2 may be substantially continuously connected to each other in a plan view. The above structure may remove an insulation layer between the first contact portion CP1 and the second contact portion CP2 to reduce a height difference of the contact member CM disposed and formed in the opening.

Figure 12:
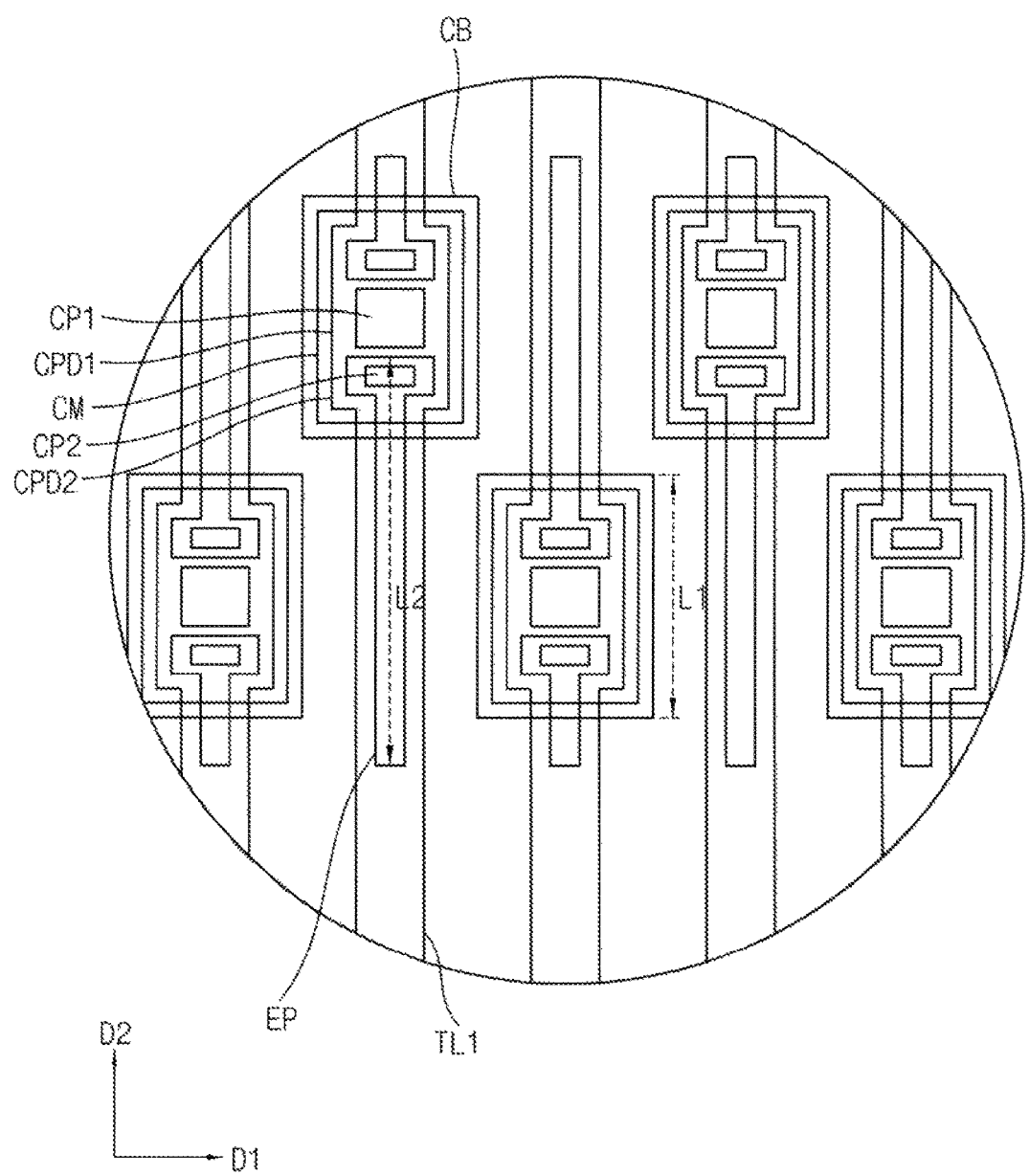
FIG. 12 is an enlarged plan view illustrating further details of a peripheral area, where a driving chip is combined, of a display device, according to one or more example embodiments of the present invention.

FIG. 12 is an enlarged plan view illustrating a peripheral area, where a driving chip is combined with (e.g., attached to or mounted on) a display substrate of a display device according to one or more example embodiments of the present invention.

Referring to FIG. 12, a display substrate includes a first connection pad CPD1, a second connection pad CPD2 disposed in a different layer from the first connection pad CPD1, and a contact member CM. The contact member CM contacts the first and second connection pads CPD1 and CPD2. The first connection pad CPD1 is connected to a first signal transfer line TL1, and may be a portion of the first signal transfer line TL1.

In the display substrate illustrated in FIG. 2, each connection structure includes the first signal transfer line TL1 and the second signal transfer line TL2. Thus, a double wiring is provided to a fan-out area, which is interposed between the region 'A' and the region 'B'.

The display substrate illustrated in FIG. 12 does not include the second signal transfer line, which is connected to the data line DL or the demultiplexer, unlike the display substrate illustrated in FIG. 2. The second connection pad CPD2 extends in a direction to overlap the first signal transfer line TL1. For example, while an extending portion EP of the second connection pad CPD2 overlaps the first signal transfer line TL1 where the driving chip is combined with the display substrate, a length of the extending portion EP or the second connection pad CPD2 including the extending portion EP is less than a length of the first signal transfer line TL1. Thus, the extending portion EP is not disposed in a fan-out area so that a single wiring of the first signal transfer line TL1 is disposed in the fan-out area. For example, the extending portion EP may be disposed on the first signal transfer line TL1.

The above structure may allow other wirings to be disposed in the fan-out area. For example, other wirings, which are utilized for driving pixels, may be formed from a metal pattern disposed in a same layer as the second connection pad CPD2.

Furthermore, as a result of pressure applied to the components of the display device, damage to an insulation layer and a wiring in the process of combining the conductive bump CB may occur in an area overlapping the conductive bump CB and an area adjacent to the conductive bump CB. Thus, even though the second signal transfer line is not formed in the fan-out area, instances of disconnection may be prevented or reduced.

According to some example embodiments of the present invention, a plurality of connection structures respectively including the contact member CM and the conductive bump CB may form at least two rows, and may be arranged in a staggered configuration so that the connection structures disposed in adjacent two columns may be disposed in different rows. The extending portion EP may be disposed between adjacent conductive bumps CB. According to some example embodiments, the extending portion EP may be disposed on the first signal transfer line TL1.

The extending portion EP may extend such than an end of the extending portion EP may be closer to an active area than an end of the conductive bump CB adjacent to the extending portion EP is. For example, a width, which is a length along a second direction D2, of an entire area where the second connection pads CPD2 are formed, may be greater than a width, which is a length along the second direction D2, of an entire area where the conductive bumps CB are formed. The above-described structure may protect areas affected by the pressing process for providing the conductive bumps CB.

For example, when the contact members CM form a first row and a second row, and when the second row is closer to the active area than the first row is, an end of the extending portion EP connected to the contact member CM in the first row may be closer to the active area than an end of the conductive bump in the second row.

Furthermore, a length L2 of the extending portion EP or the second connection pad CPD2 including the extending portion EP may be greater than a length L1 of the conductive bump CB.

Figure 13:
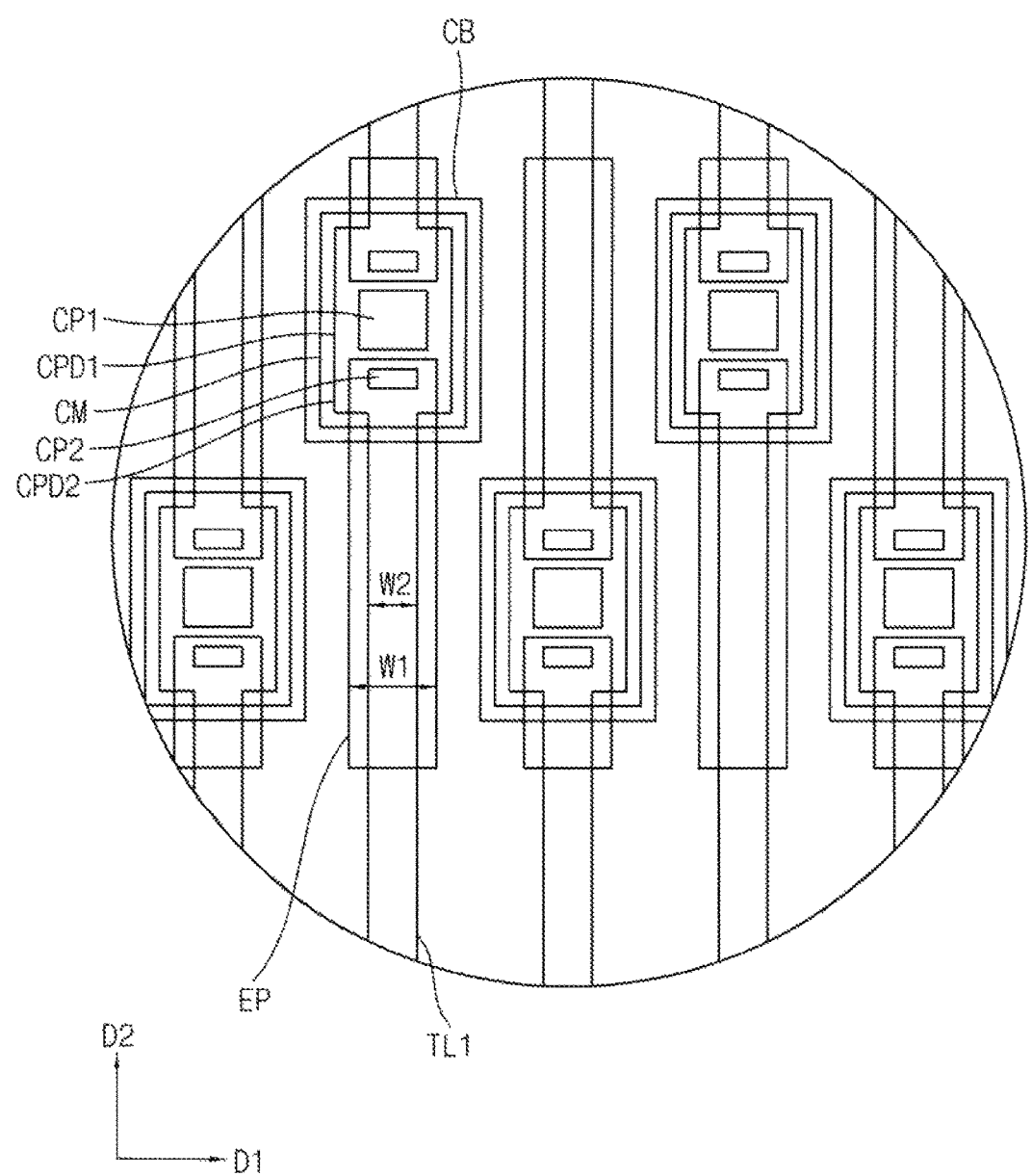
FIG. 13 is an enlarged plan view illustrating further details of a peripheral area, where a driving chip is combined, of a display device, according to one or more example embodiments of the present invention.

FIG. 13 is an enlarged plan view illustrating a peripheral area, where a driving chip is combined, of a display device according to some example embodiments of the present invention.

Referring to FIG. 13, a display substrate includes a first connection pad CPD1, a second connection pad CPD2 disposed in a different layer from the first connection pad CPD1, and a contact member CM. The contact member CM contacts the first and second connection pads CPD1 and CPD2. The first connection pad CPD1 is connected to a first signal transfer line TL1.

The second connection pad CPD2 extends in a direction to overlap the first signal transfer line TL1. For example, an extending portion EP of the second connection pad CPD2 overlaps the first signal transfer line TL1 where the driving chip is combined with the display substrate. The extending portion EP is not disposed in a fan-out area so that a single wiring of the first signal transfer line TL1 is disposed in the fan-out area. The extending portion EP may extend such than an end of the extending portion EP may be closer to an active area than an end of the conductive bump CB adjacent to the extending portion EP is.

According to some example embodiments of the present invention, the extending portion EP is disposed on the first signal transfer line TL1, and has a width W1 greater than a width W2 of the first signal transfer line TL1.

According to some example embodiments of the present invention, the extending portion EP covers an adjacent area to the first signal transfer line TL1 as well as an area overlapping the first signal transfer line TL1. Thus, the extending portion EP may widely protect the first signal transfer line TL1.

Hereinafter, a display device including the connection structure for a driving chip and an array of organic light-emitting pixels and a method for manufacturing the display device will be more fully explained.

Figure 14:
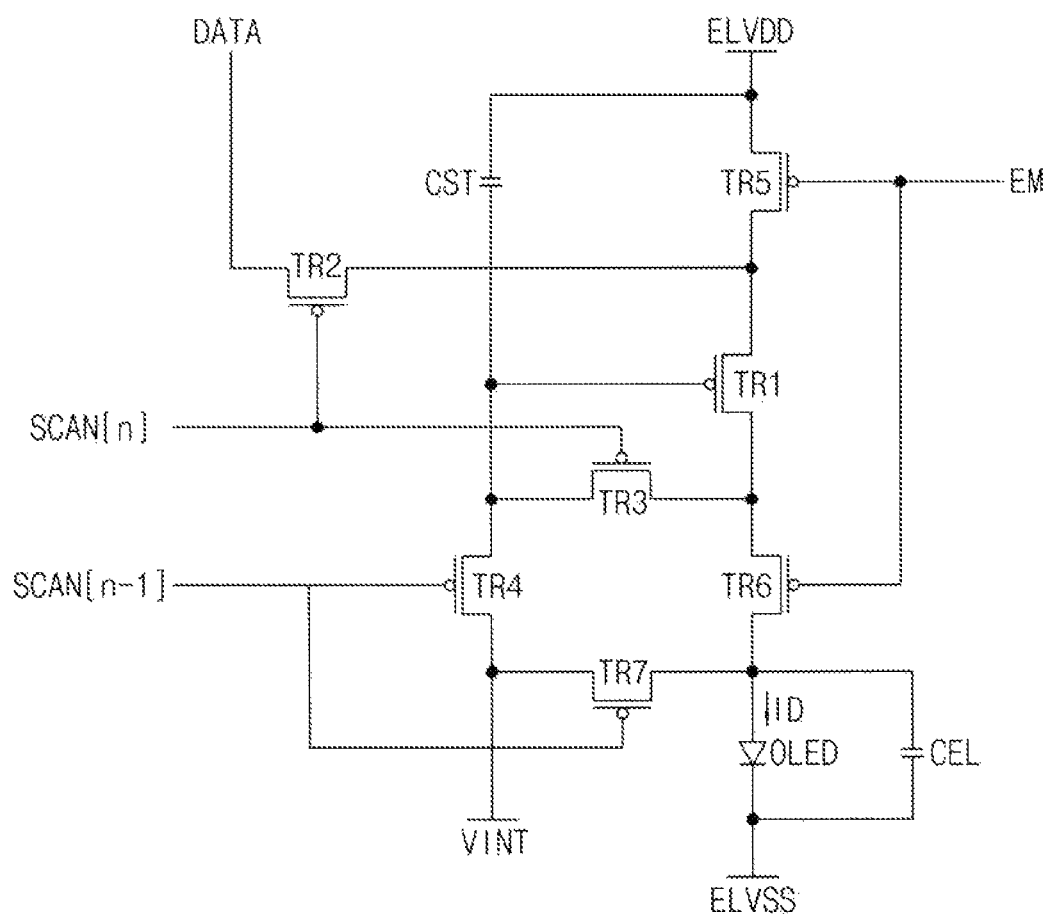
FIG. 14 is a circuit diagram illustrating a pixel of a display device, according to one or more example embodiments of the present invention.

FIG. 14 is a circuit diagram illustrating a pixel (e.g., a pixel PX illustrated in FIG. 1) of a display device according to one or more example embodiments of the present invention.

Referring to FIG. 14, a pixel PX includes an organic light-emitting diode (OLED), a first transistor TR1, a second transistor TR2, a third transistor TR3, a storage capacitor CST, a fourth transistor TR4, a fifth transistor TR5, a sixth transistor TR6, and a seventh transistor TR7. In one or more example embodiments of the present invention, the pixel PX further includes a cell capacitor CEL generated by a parasitic capacitance.

The OLED emits light based on a driving current ID. The OLED may include a first terminal and a second terminal. According to one or more example embodiments of the present invention, the second terminal of the OLED receives a second power voltage ELVSS. In an example embodiment, the first terminal is an anode, and the second terminal is a cathode of the OLED.

The first transistor TR1 includes a gate terminal, a first terminal, and a second terminal. A driving current ID may be generated by the first transistor TR1. In one or more example embodiments of the present invention, the first transistor TR1 operates in a saturation region. In this case, the first transistor TR1 may generate the driving current ID based on a voltage difference between the gate terminal and the source terminal, and a gradation may be implemented based on an amount of the driving current ID generated by the first transistor TR1. In one or more example embodiments of the present invention, the first transistor TR1 operates in a linear region. In this case, a gradation may be implemented based on a time during which the first transistor TR1 provides the driving current ID to the OLED within one frame.

The second transistor TR2 may include a gate terminal, a first terminal, and a second terminal. The gate terminal may receive a current scan signal SCAN[n]. The first terminal may receive a data signal DATA. The second terminal may be connected to the first terminal of the first transistor TR1.

The second transistor TR2 may transfer the data signal DATA to the first terminal of the first transistor TR1 during an active period of the current scan signal SCAN[n].

The third transistor TR3 may include a gate terminal, a first terminal, and second terminal. The gate terminal may receive the current scan signal SCAN[n]. The first terminal may be connected to the second terminal of the first transistor TR1. The second terminal may be connected to the gate terminal of the first transistor TR1.

The third transistor TR3 may connect the gate terminal of the first transistor TR1 and the second terminal of the first transistor TR1 to each other during the active period of the current scan signal SCAN[n]. Thus, the third transistor TR3 allows the first transistor TR1 to be diode-connected during the active period of the current scan signal SCAN[n].

The storage capacitor CST may be connected between a first power voltage ELVDD and the gate terminal of the first transistor TR1. The storage capacitor CST may maintain a voltage level of the gate terminal of the first transistor TR1 during an inactive period of the current scan signal SCAN[n]. The inactive period of the current scan signal SCAN[n] may include an active period of an emission signal EM, and the driving current ID generated by the first transistor TR1 may be supplied to the OLED during an active period of the emission signal EM. Thus, the driving current ID generated based on the voltage level maintained by the storage capacitor CST may be supplied to the OLED.

The fourth transistor TR4 may include a gate terminal, a first terminal, and a second terminal. The gate terminal may receive a previous scan signal SCAN[n−1]. The first terminal may receive an initialization voltage VINT. The second terminal may be connected to the gate terminal of the first transistor TR1.

The fourth transistor TR4 may provide the initialization voltage VINT to the gate terminal of the first transistor TR1 during an active period of the previous scan signal SCAN[n−1]. Thus, the fourth transistor TR4 initializes the gate terminal of the first transistor TR1 to the initialization voltage VINT during the active period of the previous scan signal SCAN[n−1]. As a result, the previous scan signal SCAN[n−1] may serve as a data initialization signal.

The fifth transistor TR5 may include a gate terminal, a first terminal, and a second terminal. The gate terminal may receive the emission signal EM. The first terminal may receive the first power voltage ELVDD. The second terminal may be connected to the first terminal of the first transistor TR1.

The fifth transistor TR5 may provide the first power voltage ELVDD to the first terminal of the first transistor TR1 during an active period of the emission signal EM. In contrast, the fifth transistor TR5 may block the first power voltage ELVDD during an inactive period of the emission signal EM. While the fifth transistor TR5 provides the first power voltage ELVDD to the first terminal of the first transistor TR1 during the active period of the emission signal EM, the first transistor TR1 may generate the driving current ID. Furthermore, while the fifth transistor TR5 blocks the first power voltage ELVDD during the inactive period of the emission signal EM, the data signal DATA may be provided to the first terminal of the first transistor TR1.

The sixth transistor TR6 may include a gate terminal, a first terminal, and a second terminal. The gate terminal may receive the emission signal EM. The first terminal may be connected to the second terminal of the first transistor TR1. The second terminal may be connected to the first terminal of the OLED.

The sixth transistor TR6 may provide the driving current ID generated by the first transistor TR1 to the OLED during the active period of the emission signal EM. While the sixth transistor TR6 provides the driving current ID to the OLED during the active period of the emission signal EM, the OLED may emit light based on the driving current ID. While the OLED is disconnected from the first transistor TR1 by the sixth transistor TR6 during the inactive period of the emission signal EM, a voltage (e.g., the data signal DATA compensated for the threshold voltage deviation) at the second terminal of the first transistor TR1 may be provided to the gate terminal of the first transistor TR1 through the third transistor TR3.

The seventh transistor TR7 may include a gate terminal, a first terminal, and a second terminal. The gate terminal may receive the previous scan signal SCAN[n−1]. The first terminal may receive the initialization voltage VINT. The second terminal may be connected to the first terminal of the OLED.

The seventh transistor TR7 may provide the initialization voltage VINT to the first terminal of the OLED during the active period of the previous scan signal SCAN[n−1]. Thus, the seventh transistor TR7 may initialize the first terminal of the OLED to the initialization voltage VINT during the active period of the previous scan signal SCAN[n−1]. As a result, the previous scan signal SCAN[n−1] may serve as a diode initialization signal.

Figure 15:
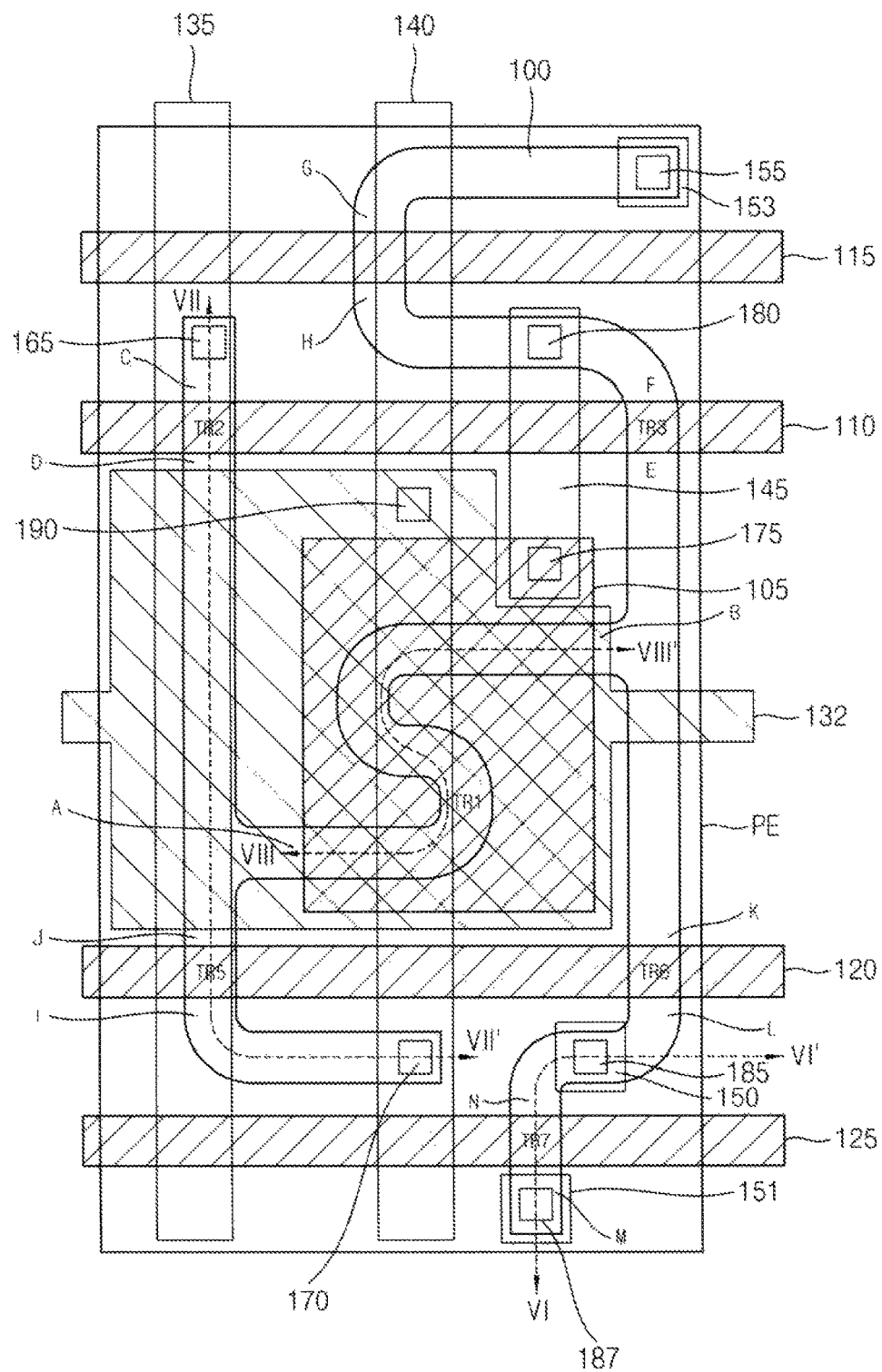
FIG. 15 is a layout diagram illustrating a pixel of a display device, according to one or more example embodiments of the present invention.

FIG. 15 is a layout diagram illustrating a pixel of a display device according to one or more example embodiments of the present invention. The layout of the pixel may be configured to embody the circuit illustrated in FIG. 14.

Referring to FIGS. 14 and 15, a display device includes an active pattern 100, a first gate electrode 105, a second gate electrode 110, a third gate electrode 115, a forth gate electrode 120, and a fifth gate electrode 125.

The active pattern 100 may include first to fourteenth regions A, B, C, D, E, F, G, H, I, J, K, L, M, and N. The regions A, B, C, D, E, F, G, H, I, J, K, L, M, and N may be doped with an impurity, and thus may have electrical conductivity higher than those of other regions of the active pattern 100. The regions A, B, C, D, E, F, G, H, I, J, K, L, M, and N may be source terminals or drain terminals of first through seventh transistors TR1, TR2, TR3, TR4, TR5, TR6, and TR7. Thus, the regions A, B, C, D, E, F, G, H, I, J, K, L, M, and N are electrically connected to each other, and may not have a clear boundary with each other.

The first gate electrode 105 may form or define the first transistor TR1 together with the first region A and the second region B. The second gate electrode 110 may form or define the second transistor TR2 together with the third region C and the fourth region D. Furthermore, the second gate electrode 110 may further form or define the third transistor TR3 together with the fifth region E, and the sixth region F. The third gate electrode 115 may form or define the fourth transistor TR4 together with the seventh region G and the eighth region H. The fourth gate electrode 120 may form or define the fifth transistor TR5 together with the ninth region I and the tenth region J. Furthermore, the fourth gate electrode 120 may further form or define the sixth transistor TR6 together with the eleventh region K and the twelfth region L. The fifth gate electrode 125 may form or define the seventh transistor TR7 together with the thirteenth region M and the fourteenth region N. Because regions of the active pattern 100, which are disposed under the first to fifth gate electrodes 105, 110, 115, 120, and 125, are not doped with an impurity, the regions may operate as channels of the first to seventh transistors TR1, TR2, TR3, TR4, TR5, TR6, and TR7.

The display device may further include a storage pattern 132 that overlaps at least a portion of the first gate electrode 105. The storage pattern 132 may form or define the storage capacitor CST illustrated in FIG. 14 together with the first gate electrode 105.

For example, the storage pattern 132 may extend from a region overlapping the first gate electrode 105 to overlap the first region A, the fourth region D and the tenth region J. The storage pattern 132 may receive the first power voltage ELVDD of FIG. 14.

The display device further includes a data line 135, a power line 140, a first connection pattern 145, a second connection pattern 150, a third connection pattern 153, and a fourth connection pattern 151.

The data line 135 may be electrically connected to a third region C of the active pattern 100. For example, the data line 135 may contact the third region C through a first contact hole 165. In one or more example embodiments of the present invention, the data line 135 receives the data signal DATA of FIG. 14. As a result, the data line 135 may provide the data signal DATA to the third region C through the first contact hole 165. The data line 135 may extend in a direction and may overlap the fourth region D and the tenth region J of the active pattern 100.

The power line 140 may be electrically connected to the storage pattern 132 and the ninth region I of the active pattern 100. For example, the power line 140 may contact the ninth region I through a second contact hole 170, and may contact the storage pattern 132 through a third contact hole 190. The power line 140 may receive the first power voltage ELVDD of FIG. 14. The power line 140 may extend in a direction, for example, in the same direction as the data line 135.

The first connection pattern 145 may be electrically connected to the first gate electrode 105 and the eighth region H of the active pattern 100. For example, the first connection pattern 145 may contact the first gate electrode 105 through a fourth contact hole 175, and may contact the eighth region H through a fifth contact hole 180. As a result, the first connection pattern 145 may electrically connect the first gate electrode 105 and the eighth region H to each other.

The second connection pattern 150 may contact the twelfth region L of the active pattern 100 through a sixth contact hole 185. Furthermore, the second connection pattern 150 contacts a pixel electrode PE. As a result, the driving current ID generated by the first transistor TR1 of FIG. 1 may be provided to the OLED.

The third connection pattern 153 may contact the seventh region G through a seventh contact hole 155. For example, the third connection pattern 153 may provide the initialization voltage VINT to the seventh region G.

The fourth connection pattern 151 may contact the thirteenth region M through an eighth contact hole 187. For example, the fourth connection pattern 151 may provide the initialization voltage VINT to the thirteenth region M.

Figure 16B:
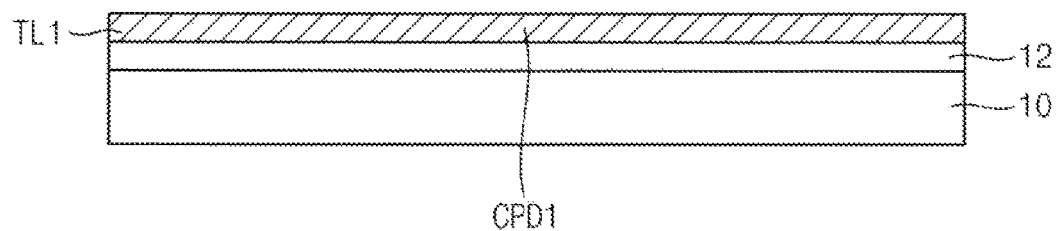
Figure 17A:
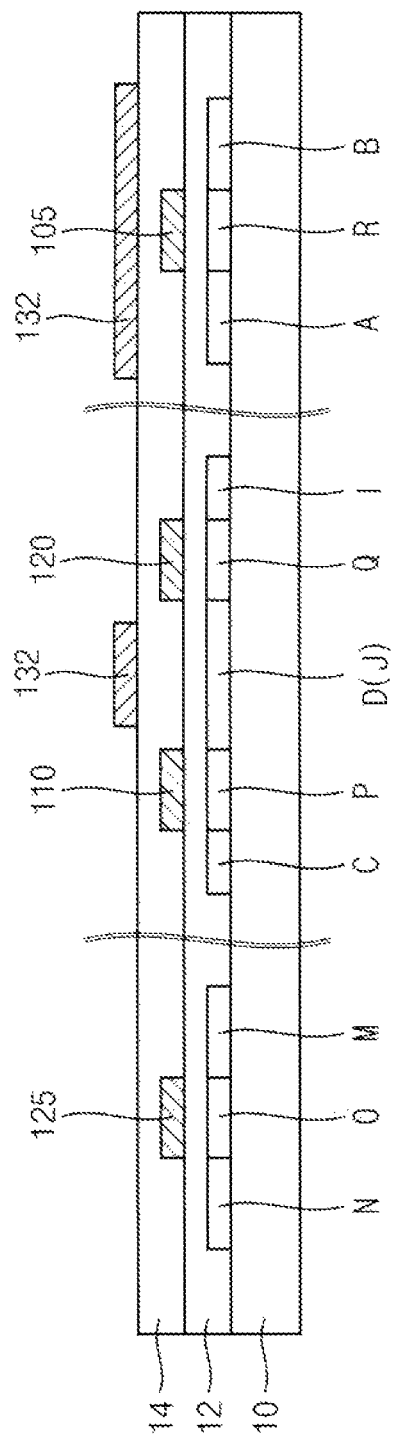
Figure 17B:
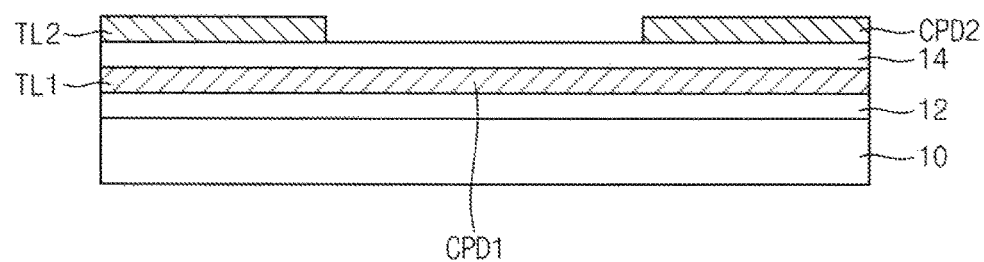
Figure 18A:
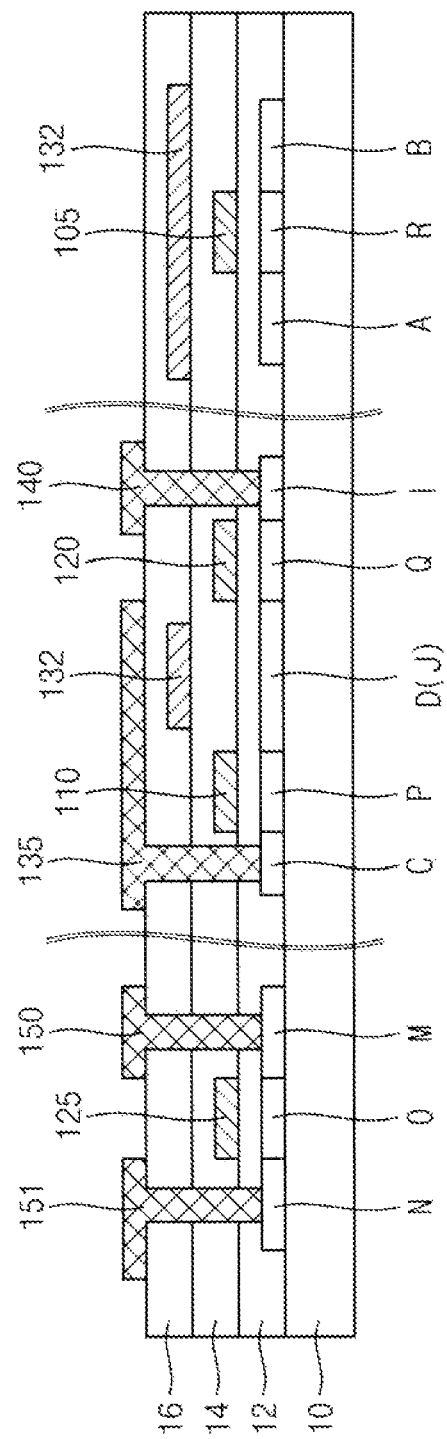
Figure 18B:
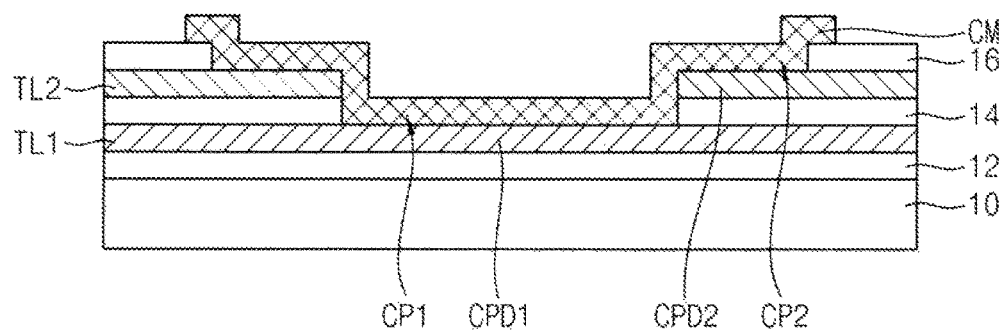

FIGS. 16A, 16B, 17A, 17B, 18A, 18B, and 19 are cross-sectional views illustrating a method for manufacturing a display device according to some example embodiments of the present invention. For example, FIGS. 16A, 17A, 18A and 19 are cross-sectional views taken along the lines VI-VI', VII-VII' and VIII-VIII' of FIG. 5 to show a pixel area, and FIGS. 16B, 17B, and 18B are cross-sectional views taken along the line III-III' of FIG. 6 to show an area where a driving chip is combined. Hereafter, each of the cross-sectional views may be explained with corresponding plan views.

Referring to FIGS. 15 and 16A, a semiconductor layer is formed on a base substrate 10, and patterned to form a semiconductor pattern. The semiconductor pattern may include amorphous silicon, polysilicon or semiconductive oxide. In an exemplary embodiment, the semiconductor pattern may include polysilicon formed by crystallizing amorphous silicon.

A first gate insulation layer 12 is formed to cover the semiconductor pattern. The first gate insulation layer 12 may include silicon oxide, silicon nitride, silicon oxynitride, silicon carbonitride, silicon oxycarbide or the like.

Referring to FIGS. 15, 16A and 16B, a first gate metal layer is formed on the first gate insulation layer 12, and patterned to form a first gate metal pattern including a first gate electrode 105, a second gate electrode 110, a third gate electrode 115, a fourth gate electrode 120, a fifth gate electrode 125, and a first connection pad CPD1.

Thereafter, regions of the semiconductor pattern are doped with impurities to form an active pattern including first to fourteenth regions A, B, C, D, E, F, G, H, I, J, K, L, M, and N, which are doped with the impurities, and channel regions O, P, Q, and R, which are not doped with the impurities.

Referring to FIGS. 15, 17A, and 17B, a second gate insulation layer 14 is formed to cover the first gate metal pattern. A second gate metal layer is formed on the second gate insulation layer 14, and patterned to form a second gate metal pattern including a storage pattern 132 and a second connection pad CPD2. The second gate metal pattern may include a substantially same material as the first gate metal pattern.

Referring to FIGS. 15, 18A, and 18B, a first interlayer insulation layer 16 is formed to cover the second gate metal pattern. A source metal layer is formed on the first interlayer insulation layer 16, and patterned to form a source metal pattern including a data line 135, a power line 140, a first connection pattern 145, a second connection pattern 150, a third connection pattern 153, a fourth connection pattern 151, and a contact member CM.

Figure 19:
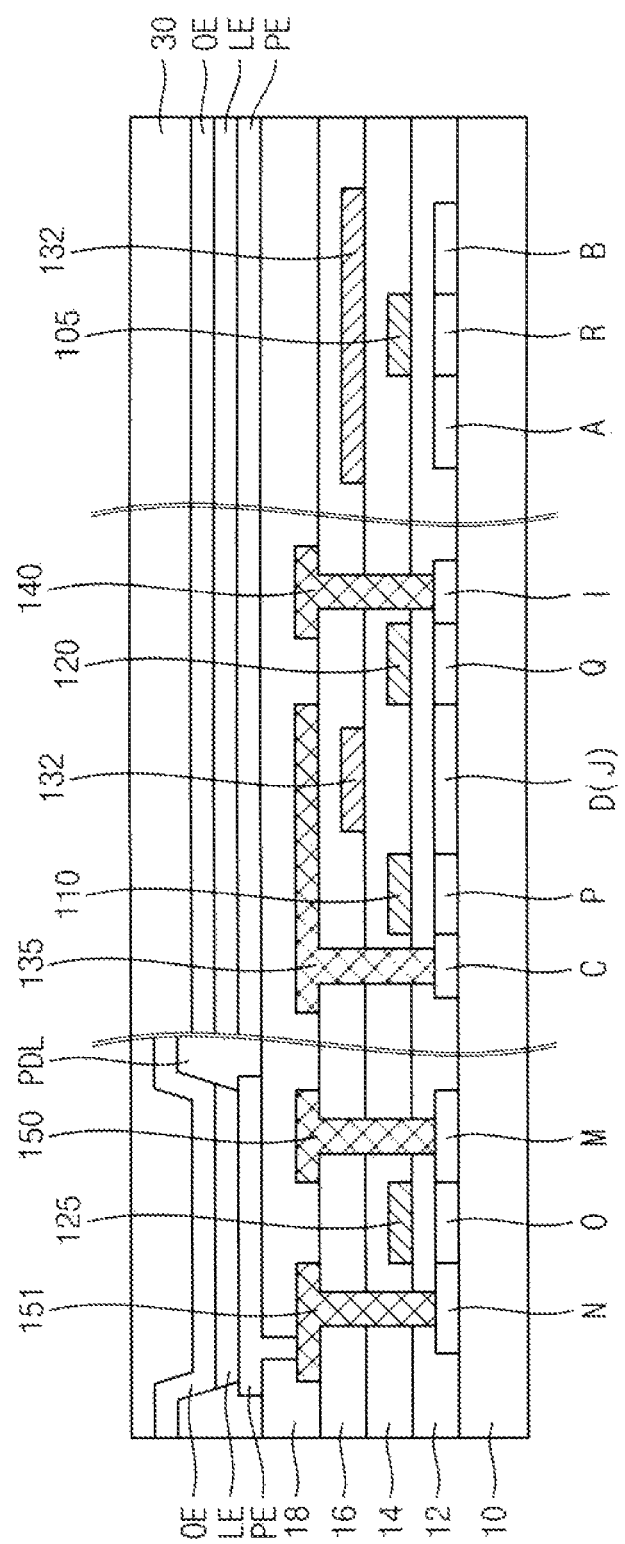

Referring to FIG. 19, a second interlayer insulation layer 18 is formed to cover the source metal pattern. The second interlayer insulation layer 18 flattens an upper surface of the substrate, and exposes at least a portion of the fourth connection pattern 151. Thereafter, a pixel electrode PE is formed on the second interlayer insulation layer 18. The pixel electrode PE contacts the fourth connection pattern 151. Thereafter, a pixel-defining layer PDL is formed to have an opening at least a portion of the pixel electrode PE. Thereafter, a light-emitting layer LE is formed to be disposed in the opening of the pixel-defining layer PDL on the pixel electrode PE. Thereafter, an opposing electrode OE is formed to contact an upper surface of the light-emitting layer LE. Thereafter, a protective layer 90 is formed to cover the opposing electrode OE.

According to some example embodiments, each of the second gate insulation layer 14 and the first interlayer insulation layer 16 may include an inorganic insulation material such as silicon oxide, silicon nitride, silicon oxynitride, silicon carbonitride, silicon oxycarbide or the like.

According to some example embodiments, the second interlayer insulation layer 18 and the pixel-defining layer PDL may include an organic insulation material such as an acryl resin, a polyimide resin, a phenol resin, a polyamide resin, a silioxane resin or the like.

According to some example embodiments, the first gate metal pattern, the second gate metal pattern and the source metal pattern may include aluminum (Al), silver (Ag), tungsten (W), copper (Cu), nickel (Ni), chromium (Cr), molybdenum (Mo), titanium (Ti), platinum (Pt), tantalum (Ta), neodymium (Nd) or scandium (Sc), an alloy thereof, zinc oxide (ZnOx), indium tin oxide (ITO), tin oxide (SnOx), indium oxide (InOx), gallium oxide (GaOx), indium zinc oxide (IZO) or the like. These can be used each alone or in a combination thereof. Furthermore, the first gate metal pattern, the second gate metal pattern and the source metal pattern may include same materials as each other, or may include different materials from each other.

For example, the pixel electrode PE and the opposing electrode OE may include a metal, a metal alloy, a metal nitride, a conductive metal oxide, a transparent conductive material or the like. These can be used each alone or in a combination thereof.

For example, the light-emitting layer LE may include at least one of a hole injection layer, a hole transport layer, an organic light-emitting layer, an electron transport layer and an electron injection layer to have a single-layered structure or a multi-layered structure. The light-emitting layer LE may include a low molecular weight organic compound or a high molecular weight organic compound.

Thereafter, a conductive combination member such as a conductive bump, and a driving chip are disposed on the contact member CM. The driving chip may be combined with the display device, for example, through a heat-pressing process.

While an organic light-emitting display device is above-explained for an exemplary embodiment, the present inventive concept is not limited thereto, and may be used for a different display device including a driving chip, for example, a liquid crystal display device or the like.

A display device according to one or more example embodiments may be widely used for various electronic devices including a driving chip. For example, a display device according to exemplary embodiments may be used for a computer, a notebook computer, a digital camera, a video camcorder, a mobile phone, a smart phone, a smart pad, a PMP, a PDA, an MP3 player, a navigator for a vehicle, a head-up display or the like.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The foregoing is illustrative of example embodiments and is not to be construed as limiting thereof. Although example embodiments have been described, those skilled in the art will readily appreciate that many modifications are possible in the example embodiments without materially departing from the novel teachings and aspects of the present invention. Accordingly, all such modifications are intended to be included within the scope of the present invention. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present invention, as set forth in the following claims and equivalents thereof.

What is claimed is:

1. A display device comprising:
a display substrate having an active area, which comprises a pixel array, and a peripheral area around the active area;
a driving chip on the display substrate; and
a conductive combination member connecting the display substrate to the driving chip,
wherein the display substrate comprises:
a first signal line in the peripheral area to transfer a driving signal from the driving chip to the active area, the first signal line including a first connection pad;
a second connection pad at a different layer from the first connection pad and overlapping at least a portion of the first signal line; and
a contact member contacting the first connection pad, the second connection pad, and the conductive combination member.

2. The display device of claim 1, wherein the display substrate further comprises a second signal line connected to the second connection pad to transfer the driving signal to the active area.

3. The display device of claim 2, wherein the first and second signal lines are electrically connected to a data line in the active area or a demultiplexer connected to the data line.

4. The display device of claim 2, wherein the second connection pad and the second signal line are on the first connection pad and the first signal line.

5. The display device of claim 1, wherein the display substrate further comprises a first insulation layer on the first signal line, the first insulation layer comprising an opening exposing the first connection pad through the first insulation layer.

6. The display device of claim 5, wherein the display substrate further comprises a second insulation layer on the second connection pad, the second insulation layer comprising an opening exposing the first connection pad and the second connection pad through the second insulation layer.

7. The display device of claim 2, wherein the first and second signal lines comprise a same material.

8. The display device of claim 2, wherein the first and second signal lines comprise a different material from the contact member.

9. The display device of claim 1, wherein the pixel array comprises:
a gate electrode formed from a same layer as the first signal line;
a storage pattern formed from a same layer as the second connection pad and overlapping at least a portion of the gate electrode; and
a data line formed form a same layer as the contact member.

10. The display device of claim 1, further comprising a data line configured to provide the driving signal to the pixel array.

11. The display device of claim 1, wherein the contact member comprises a first contact portion contacting the first connection pad, and a second contact portion contacting the second connection pad.

12. The display device of claim 11, wherein the conductive combination member overlaps the first contact portion and the second contact portion in a plan view.

13. The display device of claim 11, wherein the contact member extends continuously from the first contact portion to the second contact portion in a plan view.

14. The display device of claim 11, wherein the conductive combination member overlaps the first contact portion, and is spaced apart from the second contact portion, in a plan view.

15. The display device of claim 1, wherein the second connection pad includes an extending portion that extends along the first signal line and overlaps the first signal line.

16. The display device of claim 15, wherein a length of the second connection pad including the extending portion is less than a length of the first signal line.

17. The display device of claim 16, wherein the length of the second connection pad including the extending portion is greater than a length of an area overlapping the conductive combination member.

18. The display device of claim 15, wherein the first signal line comprises a plurality of first signal lines, and the conductive combination member includes a plurality of conductive bumps each corresponding to one of the first signal lines and arranged in a staggered configuration, wherein the extending portion extends in a first direction and is between the conductive bumps adjacent the extending portion and spaced apart from each other in a direction crossing the first direction.

19. The display device of claim 18, wherein a length of the extending portion is greater than a length of the conductive bumps adjacent thereto.

20. The display device of claim 16, wherein the second connection pad including the extending portion is on the first signal line, wherein a width of the extending portion is greater than a width of the first signal line.

21. A display device comprising:
a display substrate having a display area and a non-display area around the display area;
a driving chip on the display substrate;
a first connection pad on the display substrate;
a second connection pad on the display substrate and offset from the first connection pad in a direction normal to the display substrate; and
a contact layer on the display substrate, wherein the driving chip is electrically connected to the first connection pad and the second connection pad through the contact layer.

22. The display device of claim 21, further comprising a conductive combination member connecting the driving chip to the display substrate through the contact layer.

23. The display device of claim 21, further comprising a first signal line to transfer a driving signal from the driving chip to the display area, wherein the first signal line comprises the first connection pad.

24. The display device of claim 23, further comprising a second signal line over the first signal line, wherein the second signal line comprises the second connection pad.

25. The display device of claim 21, wherein the contact layer is directly connected to the first connection pad and the second connection pad.

* * * * *